(12) United States Patent
Kobernik et al.

(10) Patent No.: US 7,167,395 B1
(45) Date of Patent: Jan. 23, 2007

(54) NON-VOLATILE SEMICONDUCTOR MEMORY

(75) Inventors: Gert Kobernik, Dresden (DE); Uwe Augustin, Dresden (DE)

(73) Assignee: Infineon Technologies Flash GmbH & Co. KG (DE)

( * ) Notice: Subject to any disclaimer, the term of this patent is extended or adjusted under 35 U.S.C. 154(b) by 0 days.

(21) Appl. No.: 11/181,387

(22) Filed: Jul. 13, 2005

(51) Int. Cl.
  *G11C 11/34* (2006.01)
(52) U.S. Cl. .............................. 365/185.21; 365/189.09
(58) Field of Classification Search .......... 365/185.21, 365/189.09, 185.12, 185.23
  See application file for complete search history.

(56) References Cited

U.S. PATENT DOCUMENTS

| | | | | |
|---|---|---|---|---|
| 5,790,453 | A | * | 8/1998 | Chevallier .............. 365/185.03 |
| 5,870,333 | A | * | 2/1999 | Matsumoto .............. 365/185.2 |
| 6,363,015 | B1 | * | 3/2002 | Barcella et al. ........ 365/185.21 |
| 6,674,666 | B1 | * | 1/2004 | Maone et al. .......... 365/185.21 |

\* cited by examiner

*Primary Examiner*—Anh Phung
(74) *Attorney, Agent, or Firm*—Dickstein, Shapiro, LLP.

(57) ABSTRACT

A method for determining a reading voltage for reading data out of a non-volatile semiconductor memory, wherein the semiconductor memory comprises a plurality of memory cells grouped in a first memory area and a second memory area. A given number of "0"s are stored into the second memory area, and an equal number of "0"s and "1"s are stored in the memory cells of the first memory area. The memory cells of the first memory area are read using an initial first reading voltage. The first reading voltage is adjusted and the memory cells of the first memory area are re-read until an equal number of "0"s and "1"s are read out of the memory cells of the first memory area, to thereby obtain a final first reading voltage. An initial second reading voltage is determined on the basis of the final first reading voltage. The memory cells of the second memory area are read using the initial second reading voltage. The second reading voltage is adjusted and the memory cells of the second memory area are re-read until the number of "0"s read is equal to the number of "0"s stored in the second memory area, thereby obtaining a final second reading voltage. The final second reading voltage is used as a reading voltage for reading the memory cells of the semiconductor memory.

15 Claims, 4 Drawing Sheets

NON-VOLATILE SEMICONDUCTOR MEMORY

FIELD OF THE INVENTION

The present invention relates to non-volatile semiconductor memories and to methods for determining reading voltages for reading data out of the memory cells of such memories.

BACKGROUND OF THE INVENTION

The storage capacity of flash memories can be increased by increasing the number of bits stored per memory cell. Nitride programmable read-only memory (NROM) cells are non-volatile memory cells that can store two bits per cell. FIG. 1 shows a sectional view through an NROM cell as known in the prior art. In a memory, the gate G of the cell will be connected to a wordline and the two source/drain regions S/D will be connected to bitlines. Below the gate G is the so-called ONO layer which consists of a nitride layer NL sandwiched between a top oxide layer TO and a bottom oxide layer BO. Electric charge can be stored in the nitride layer NL at a first location B1 and at a second location B2. The amount of charge stored in each location can be adjusted independently from the charge stored in the other location, so that it is possible to store two bits in a single cell.

The amount of electrical charge stored determines a threshold voltage value Vth, which is the voltage applied to the gate G that is required for a channel of electrons to exist underneath the ONO layer in the semiconductor substrate SB so that the memory cell conducts current. The threshold voltage Vth is increased when electrons are trapped on the nitride layer. A high threshold voltage Vth corresponds to a programmed state ("0") in which the cell does not conduct current, while a low threshold voltage Vth corresponds to an erased state ("1") in which the memory cell conducts current.

Programming the first bit involves applying voltages of, for example, 4.5 V to the source/drain S/D which is close to the first location B1, 0 V to the second source/drain S/D, and 9 V to the gate G so that hot electrons will tunnel from the channel of the cell into the nitride layer NL.

Erasing the first bit involves hot hole injection by applying, for example, a voltage of 8 V to the source/drain S/D close to the first location B1, floating the other source/drain S/D and applying a negative voltage to the gate G. As a consequence, electrons trapped on the nitride layer enter the semiconductor substrate SB via Fowler-Nordheim tunnelling. Ideally, the threshold voltage Vth thus reverts to the original, unprogrammed threshold voltage of the memory cell.

Reading the first bit involves applying a reading voltage VR that is between the threshold voltage of memory elements that have been erased and the threshold voltage of memory elements that have been programmed, i.e. a voltage that is between the high and the low threshold voltage, to the gate G and applying potentials of, for example, 0 V to the source/drain region S/D close to the first location B1 and 1.5 V to the other source/drain S/D region. By sensing the current flowing through the memory cell from one source/drain S/D to the other source/drain S/D, the state stored in the memory cell can be determined. For the same gate voltage the current flowing through an erased memory cell will be greater than that flowing through a programmed memory cell.

For reading, programming, and erasing the second bit, the voltages applied to the source/drain regions S/D near the first location B1 and the second location B2 are swapped.

The threshold voltages Vth of individual memory cells vary, inter alia, due to variations in the manufacture, the operating conditions and aging. FIG. 2 shows the threshold voltage distributions for memory cells storing an erased state ("1") and a programmed ("0") state. The horizontal axis represents the voltage that must be applied to the gate for the memory cell to conduct, that is the threshold voltage of the cells, while the vertical axis represents the number of memory cells N that conduct current at this voltage. In order to correctly read the states stored in the memory cells, the reading voltage VR applied to the gates G of the memory cells must lie between the lower reading voltage VL and the upper reading voltage VU. The lower reading voltage VL is the minimum voltage required for all the erased memory cells to conduct, the upper reading voltage VU is the maximum voltage allowed so that none of the programmed memory cells conduct. If the reading voltage VR is less than the lower reading voltage VL, then memory cells which are erased will be read as programmed, and if the reading voltage VR is greater than the upper reading voltage VU, then memory cells which are programmed will be read as erased. The voltage range between the upper reading voltage VU and the lower reading voltage VL forms the so-called "reading voltage window W". If the reading voltage VR lies in this window, then the erased and programmed memory cells will be read correctly.

The threshold voltage Vth of memory cells changes with usage. During programming, electrons are trapped in the nitride layer NL near one of the locations B1 and B2 via hot-electron injection. During erasure, electrons are removed from the nitride layer. However, over numerous programming cycles, the distribution of the threshold voltages can shift so far that the reading voltage VR has to be adjusted in order to avoid reading failures of the memory. Besides the shift of the threshold voltages Vth, the distributions of the threshold voltages Vth of the erased and programmed memory cells increase in width with time so that the reading voltage window W shrinks with time. The difference between the upper reading voltage VU and the lower reading voltage VL may be as small as 100 mV. Once the distributions of the erased and programmed memory cells overlap, it is no longer possible to distinguish between programmed and erased cells.

In order to correctly read the data stored in the memory cells, the reading voltage VR must be adjusted to a suitable level. One method for determining a suitable reading voltage is the so-called "moving reference concept" in which the number of zeros read from a memory area at a certain reading voltage VR are compared to the number of zeros programmed into this memory area. The number of zeros programmed is calculated and stored in a so-called "zero counter" by the memory controller before the memory area is programmed. A high initial reading voltage VR is selected and reduced step by step until the number of zeros read from the memory area is equal to the number of zeros that were programmed into this memory area.

This concept is illustrated in FIG. 3A which shows the reading voltage window W and also shows how the reading voltage VR changes over time. Starting at an initial reading voltage Vi, the reading voltage VR is successively reduced by voltage steps S until the reading voltage VR falls within the reading voltage window W. Before each decrease, all the memory cells in the memory area are read and the number of zeros read is compared to the number of zeros that were programmed into this memory area. The threshold voltages Vth may shift between 1 to 1.5 V and the reading voltage window W may be as small as 100 mV so that twenty to thirty voltage steps of 50 mV are required to find a suitable reading voltage VR.

The moving reference concept has several disadvantages. Before each decrease in the reading voltage VR, all the memory cells in the memory area have to be read. This is relatively slow (several μs) as bitlines needed to address the memory cells have to be charged and discharged. If ten to twenty steps are needed for reading data with strongly shifted threshold voltage distributions, the response time is long and the reading performance of such a memory is poor. Additionally, repeatedly reading all the memory cells leads to an increase in power consumption, which is especially undesirable if the semiconductor memory is used in mobile devices.

One solution is to reduce the number of steps and to increase the step size. However, this leads to the problems illustrated in FIGS. 3B, 3C, 3D. If the initial reading voltage Vi is not high enough, that is, if it lies below the reading voltage window W, the algorithm fails, as shown in FIG. 3B. If the number of steps is limited and the step size S is small, it can happen that the reading voltage window W is lower than the last step, as illustrated in FIG. 3C. If the step size S is too large, i.e. larger than the reading voltage window W, it may also be impossible to find the right reading level, as shown in FIG. 3D. In each of these cases, "0" will be read as "1" if the reading voltage is too high and "1" will be read as "0" if the reading voltage is too low. This leads to wrong data and reading failures.

SUMMARY OF THE INVENTION

The present invention provide a method for determining a reading voltage for reading data out of a non-volatile semiconductor memory which comprises a plurality of memory cells grouped in a first memory area and a second memory area, comprising the steps of storing a given number of "0"s in the second memory area, storing an equal number of "0"s and "1"s in the memory cells of the first memory area, reading the memory cells of the first memory area using an initial first reading voltage, adjusting the first reading voltage and re-reading the memory cells of the first memory area until an equal number of "0"s and "1"s are read out of the memory cells of the first memory area, thus obtaining a final first reading voltage, determining an initial second reading voltage on the basis of the final first reading voltage, reading the memory cells of the second memory area using the initial second reading voltage, adjusting the second reading voltage and re-reading the memory cells of the second memory area until the number of "0"s read is equal to the number of "0"s stored in the second memory area, thus obtaining a final second reading voltage, and using the final second reading voltage as a reading voltage for reading the memory cells of the semiconductor memory.

The invention further provides a non-volatile semiconductor memory comprising a plurality of memory cells organized in a first memory area and in a second memory area, a wordline decoder connected to the first memory area and the second memory area, a plurality of sense amplifiers connected to the first memory area and the second memory area, a reading voltage control unit connected to the plurality of sense amplifiers, a memory controller connected to the reading voltage control unit and to the wordline decoder, wherein the reading voltage control unit comprises a means for counting connected to the plurality of sense amplifiers, for counting the number of "0"s read from the first memory area in a first operating mode and for counting the number of "0"s read from the second memory area in a second operating mode.

BRIEF DESCRIPTION OF THE DRAWINGS

The invention will now be described in more detail below by way of non-limiting examples and with reference to the accompanying drawings, in which.

DETAILED DESCRIPTION OF PREFERRED EMBODIMENTS OF THE INVENTION

Figure 1:
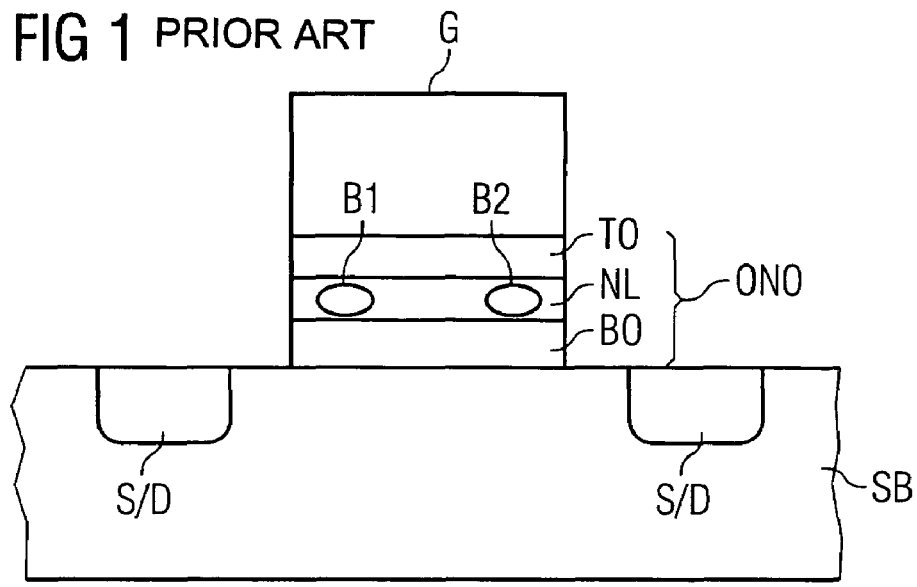
FIG. 1 shows a cross-sectional view through an NROM cell as known in prior art.
Figure 2:
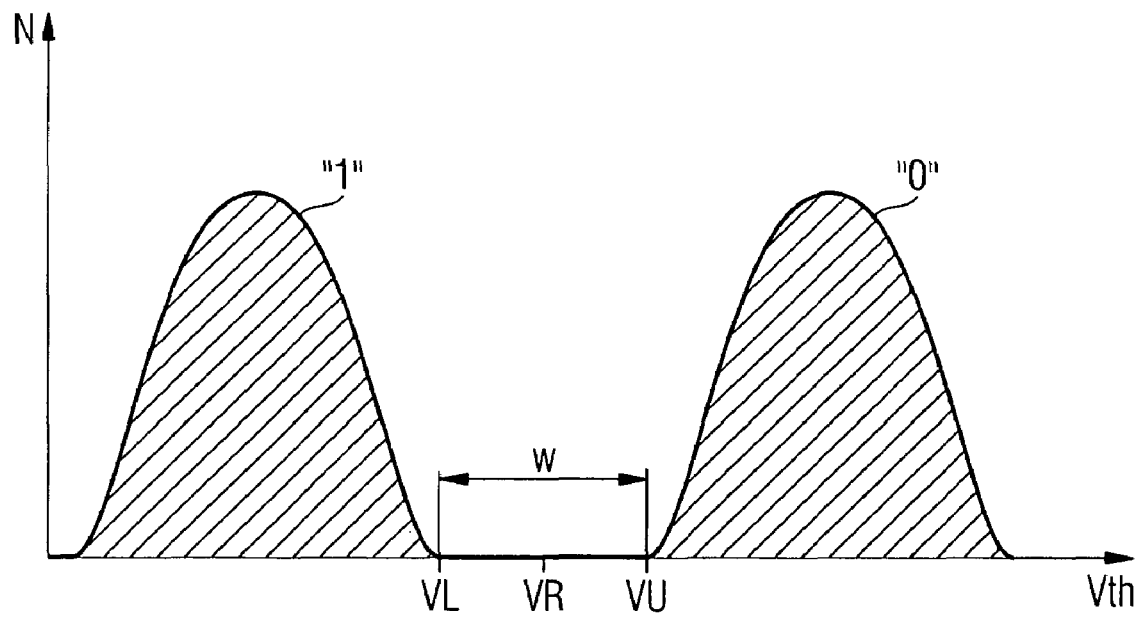
FIG. 2 shows the distribution of threshold voltages of programmed and erased memory cells as known in the prior art.
Figure 3A:
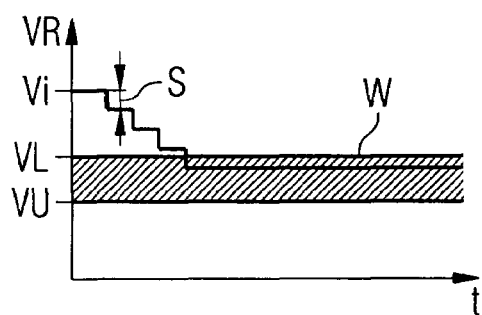
FIGS. 3A to 3D illustrate the moving reference concept.
Figure 3B:
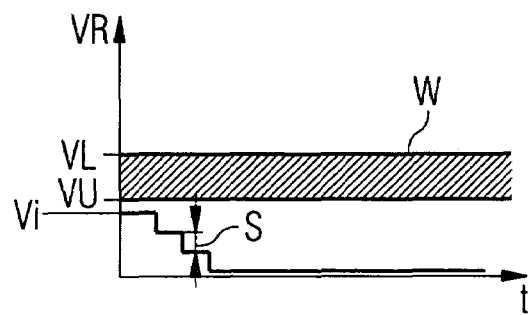
Figure 3C:
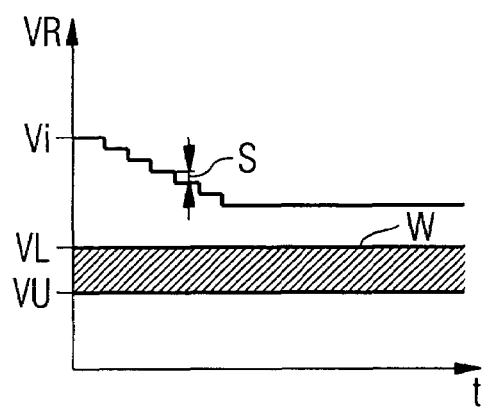
Figure 3D:
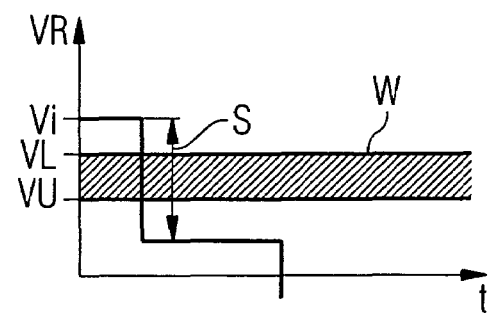

An object of the present invention is to overcome the above-mentioned disadvantages of the moving reference concept and to provide a method for determining a reading voltage VR for correctly reading data out of memory cells. Further, a suitable reading voltage VR should always be found and the time and electrical power required for determining this reading voltage VR should be significantly reduced.

There is therefore provided, in accordance with the present invention, a method for determining a reading voltage for reading data out of a non-volatile semiconductor memory which comprises a plurality of memory cells grouped in a first memory area and a second memory area, comprising the steps of storing a given number of "0"s in the second memory area, storing an equal number of "0"s and "1"s in the memory cells of the first memory area, reading the memory cells of the first memory area using an initial first reading voltage, adjusting the first reading voltage and re-reading the memory cells of the first memory area until an equal number of "0"s and "1"s are read out of the memory cells of the first memory area, thus obtaining a final first reading voltage, determining an initial second reading voltage on the basis of the final first reading voltage, reading the memory cells of the second memory area using the initial second reading voltage, adjusting the second reading voltage and re-reading the memory cells of the second memory area until the number of "0"s read is equal to the number of "0"s stored in the second memory area, thus obtaining a final second reading voltage, and using the final second reading voltage as a reading voltage for reading the memory cells of the semiconductor memory.

Using this method, a suitable reading voltage for reading the memory cells is determined in two steps, the first step being determining the reading voltage required for correctly reading the memory cells of the first memory area. As an equal number of "0"s and "1"s has been programmed into the memory cells of the first memory area, a suitable first reading voltage can be found by adjusting the reading voltage until an equal number of "0"s and "1"s are read from the memory cells of the first memory area. Programming an equal number of "0"s and "1"s avoids having to provide an extra memory to store this information. Since the first and second memory area are part of the same non-volatile semiconductor memory, the final first reading voltage can be used for determining an initial second reading voltage for reading the memory cells of the second memory area. In the second step, the second reading voltage is adjusted and the memory cells of the second memory area are re-read until the number of "0"s is equal to the number of "0"s stored in the second memory area.

Preferably, the step of storing an equal number of "0"s and "1"s in the memory cells of the first memory area comprises storing a binary number and its complement in the first memory area. Storing the binary number and its complement ensures that an equal number of "0"s and "1"s are stored in the first memory area. Further, useful information for determining a suitable reading voltage for the memory can be coded in the binary number.

Preferably, the binary number is related to the number of "0"s stored in the second memory area. By knowing that an equal number of "0"s and "1"s are stored in the first memory area, one can be certain that the final first reading voltage obtained will ensure that the binary number and its complement in the first memory area are read correctly. The first memory area can therefore be confidently used to store a binary number from which the number of "0"s which are stored in the second memory area can be obtained. This information can then be used to determine the final second reading voltage for which the correct number of "0"s are read from the second memory area.

Since the number of "0"s stored in the second memory area has been correctly read out from the first memory area, the second reading voltage can be adjusted in a more flexible way than in the prior art. In the prior art, the information about the number of "0"s stored in the memory area was also stored in a part of the memory area called zero counter. As a consequence, it was necessary to start at a high initial reading voltage and to reduce this voltage step by step. If the reading voltage is too high, then cells storing a "0" will be read as a storing "1". This will also happen in the cells of the zero counter storing the number of "0"s so that a higher number of "0"s to be expected is read out. The reading voltage will then be reduced until the number of "0"s read from the second memory area and the number of "0"s read from the zero counter are equal. The invention enables the reading voltages for the zero counter to be determined independently of the reading voltage for the rest of the memory, so that the number of "0"s stored in the memory can be determined faster.

Preferably, the binary number is related to the number of read and/or erase cycles that the semiconductor memory has been subjected to. Storing the number of read and/or erase cycles in the binary number stored in the first memory area allows an estimate for the initial first reading voltage to be made since the number of read and erase cycles affect the distribution of the threshold voltages Vth.

Preferably, the binary number is related to the age of the semiconductor memory. Since the threshold voltage distribution shifts not only with the number of erase and/or erase cycles but also with time, this information can be stored alone or together with the information about the number of erase/read cycles and/or the information of the number of "0"s stored in the second memory area to provide additional information in determining the reading voltage of the semiconductor memory. In fact, any other information, such as, for example, the last successful reading voltage, may be stored in part of the binary number for the purpose of determining a suitable reading voltage.

Preferably, the step of reading the memory cells of the first memory area comprises reading the memory cells simultaneously. If the memory cells in the first memory area are read simultaneously, the final first reading voltage can be determined very quickly. Simultaneously reading the memory cells of the first memory area can be achieved by providing a sense amplifier for each of the memory cells. In this way, it is possible to use a high initial first reading voltage, a small step size and a large number of steps for quickly and accurately determining the final first reading voltage without adversely affecting the reading performance of the semiconductor memory. No charging or discharging of bitlines will be necessary, only the voltage applied to the gates of the memory cells has to be adapted. The first memory area may be the first word in a page of memory cells.

Preferably, the initial first reading voltage corresponds to an upper permissible reading voltage of the memory cells. By using a high initial first reading voltage, it can be ensured that the reading voltage window does not lie above the initial first reading voltage.

Preferably, the step of adjusting the first reading voltage comprises decreasing the first reading voltage by first voltage steps. Decreasing the first reading voltage step by step ensures that a first reading voltage can be found for which an equal number of "0"s and "1"s are read. The final first reading voltage can then be used as an estimate for the second reading voltage. It is clear that other methods can be used for determining the final first reading voltage, such as starting with the lowest permissible reading voltage of the memory cells and increasing the first reading voltage by first voltage steps. In fact, these two methods may be combined to determine the lower and upper reading voltages of the reading voltage window which then can be combined to give an average reading voltage which lies in the middle of the reading voltage window. Other methods such as random values and divide and conquer strategies can also be used to advantage.

Preferably, the step of determining an initial second reading voltage comprises decreasing the final first reading voltage by a second voltage step. The second memory area usually contains a much larger number of memory cells than the first memory area as is it used for storing user data while the first memory area is primarily used for determining a suitable reading voltage and may just be a word. As a consequence, the threshold voltage distribution of memory cells of the first memory area is much more narrow than the distribution of the threshold voltages Vth of the memory cells of the second memory area. The final first reading voltage will, therefore, usually be too high so that finding the correct second reading voltage may be accelerated by decreasing the final first reading voltage by a second voltage step. The second voltage step may depend on the statistic properties of the distribution such as the number of memory cells in the first and second memory area. Depending on the differences in the distributions, it may not be necessary to decrease the final first reading voltage. This may also be the case, for example, if the final first reading voltage has been determined to lie in the middle of the reading voltage window.

Preferably, the step of adjusting the second reading voltage comprises decreasing the second reading voltage by third voltage steps. In this way the second reading voltage is adjusted until the number of "0"s read from the memory cells of the second memory is equal to the number of "0"s stored in the second memory area. Again, as pointed out above, in the step of adjusting the first reading voltage, a number of different approaches may be used to achieve this goal.

The invention further provides a non-volatile semiconductor memory comprising a plurality of memory cells organized in a first memory area and in a second memory area, a wordline decoder connected to the first memory area and the second memory area, a plurality of sense amplifiers connected to the first memory area and the second memory area, a reading voltage control unit connected to the plurality of sense amplifiers, a memory controller connected to the reading voltage control unit and to the wordline decoder, wherein the reading voltage control unit comprises a means for counting connected to the plurality of sense amplifiers, for counting the number of "0"s read from the first memory area in a first operating mode and for counting the number of "0"s read from the second memory area in a second operating mode.

Preferably, the memory controller selects one of the first and second operating modes and outputs a first number of "0" in the first operating mode and a second number of "0"s in the second operating mode.

Preferably, the reading voltage control unit comprises a comparator connected to the counting means and the memory controller, wherein in each of the first and the second operating modes the comparator outputs a first signal if the number of "0"s counted by the counting means is equal to the number of "0"s provided by the memory controller and outputs a second signal if the number of "0"s differ from each other.

Preferably, the reading voltage control unit comprises a reading voltage generator connected to the memory controller and to the output of the comparator, outputting a reading voltage to the plurality of sense amplifiers, wherein in the first operating mode the memory cells of the first memory area are selected by the wordline decoder and the reading voltage generator outputs and adjusts a first reading voltage until the comparator outputs the first signal, and in the second operating mode, memory cells of the second memory area are selected by the wordline decoder and the reading voltage control unit outputs and adjusts a second reading voltage until the comparator outputs the first signal, wherein the starting value of the second reading voltage is based on the first reading voltage for which the comparator outputs the first signal in the first operating mode.

Preferably, the first memory area is a word.

Preferably, the first number of "0"s output by the memory controller is equal to one half of the length of the word which makes up the first memory area.

Preferably, the second number of "0"s output by the memory controller is equal to the number of "0"s programmed in the second memory area by the memory controller.

Preferably, the memory cells of the first memory area are read in parallel by the plurality of sense amplifiers. This may be achieved by connecting a separate sense amplifier to each memory cell of the first memory area.

Preferably, the memory cells in the first memory area store an equal number of "0"s and "1"s.

Preferably, the memory cells in the first memory area store a binary number and its complement.

Preferably, the binary number is related to the number of "0"s stored in the second memory area. In this way it is possible to determine the number of "0"s stored in the second memory area by reading the binary number in the first memory area.

Preferably, the binary number is related to the number of read or erase cycles that the semiconductor memory has been subjected to.

Preferably, the memory cells are nitride read-only memory cells (NROM). The advantage of NROM-cells is that two bits can be stored in each cell.

Preferably, the nitride read-only memory cells are connected as a virtual ground array. Virtual ground arrays require reduced layout area as each bitline is shared between two memory cells.

Figure 4:
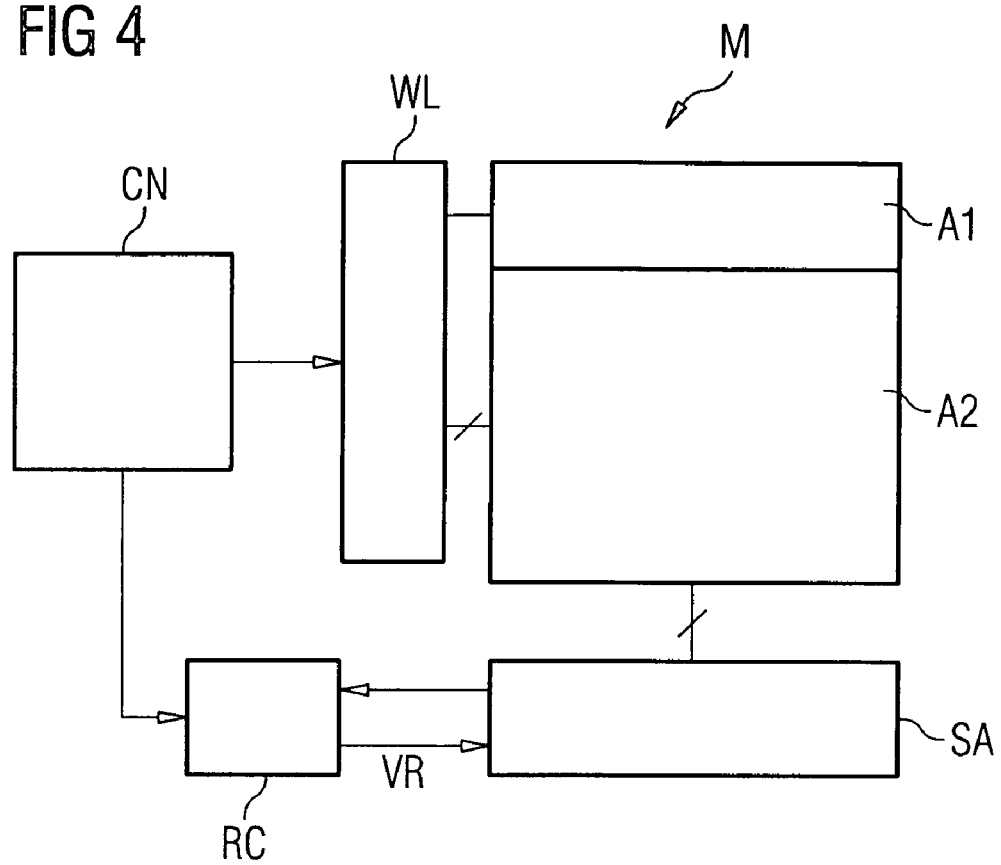
FIG. 4 shows an embodiment of the semiconductor memory according to the invention.

FIG. 4 shows an embodiment of the non-volatile semiconductor memory M according to the invention. The semiconductor memory M comprises memory cells (not shown) arranged in words in a first memory area A1 and in a second memory area A2, and can be selected by the wordline decoder WL for reading and writing. The first memory area A1 corresponds to the first word in a page with the second memory area A2 corresponding to the rest of the page. Memory cells in each word can be read out in parallel by means of the sense amplifiers SA. A reading control unit RC is connected to the sense amplifiers SA and inputs a reading voltage VR for reading the memory cells in the first and second memory area. The memory M is controlled by a memory controller CN which is connected, inter alia, to the wordline decoder WL and the reading voltage control unit RC. The reading voltage control unit RC has two inputs, one from the memory controller CN and the other from the sense amplifiers SA. The memory cells may be nitride read-only memory cells (NROM) which are arranged in a virtual ground array.

Figure 5:
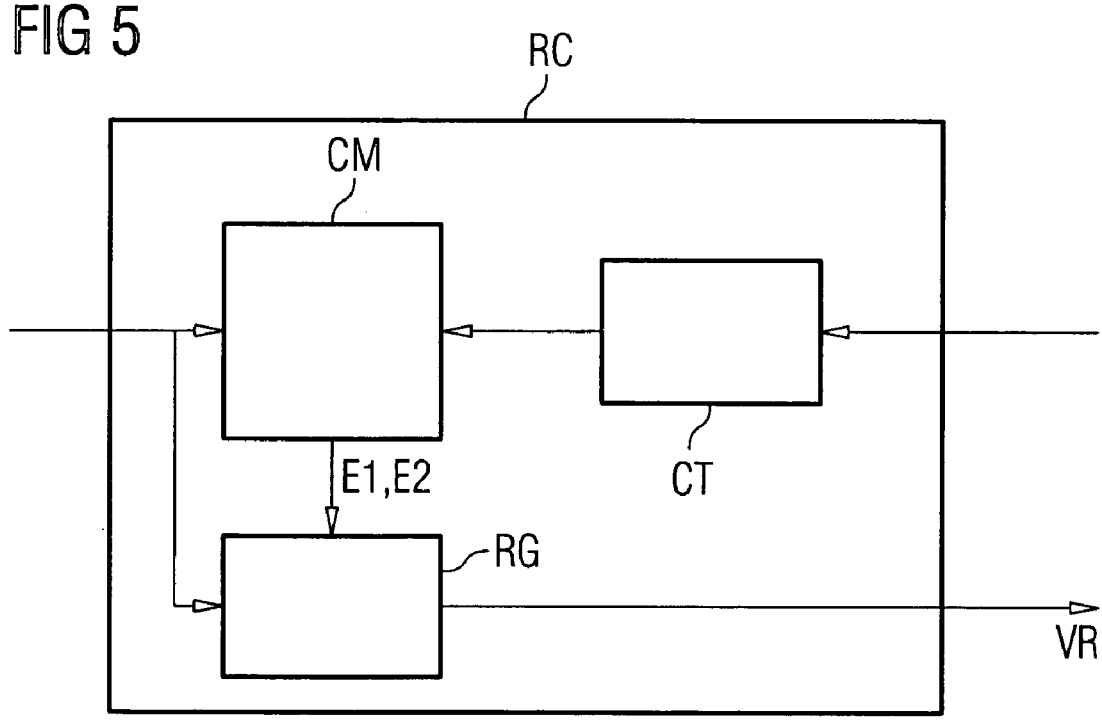
FIG. 5 shows the reading voltage control unit in detail.

FIG. 5 shows in detail the reading voltage control unit RC. The input from the sense amplifiers SA is connected to a counter CT which counts the number of "0"s in the word output by the sense amplifiers SA. Further shown is a comparator CM which is connected to the counter CT and the memory controller CN. The comparator CM compares the number of "0"s output by the memory controller CN and the number of "0"s output by the counter CT. The comparator CM outputs a first signal E1 if the number of "0"s input by the memory controller CN and the counter CT are equal and outputs a second signal E2 if the number of "0"s differ from each other. The reading voltage control unit RC further comprises a reading voltage generator RG which is connected to the output of the comparator CM and the output of the memory controller CN. The reading voltage generator RG is used to provide a reading voltage VR to the sense amplifiers SA.

The semiconductor memory M can be operated in two modes by the memory controller CN. In the first operating mode, the first memory area A1 is selected by the wordline decoder WL for reading by the sense amplifier SA. The sense amplifiers SA read all of the memory cells MC in the first memory area A1 in parallel. This may be achieved by providing a sense amplifier for each memory cell of the first memory area A1.

In the first operating mode, the memory controller outputs a first number of "0"s which is equal to half of the word length of the word stored in the first memory area A1. If the first memory area A1 stores a 64 bit word, then the first number of "0"s output by the memory controller CN is 32. The reading voltage control unit RC counts the number of "0"s output by the sense amplifiers SA when reading the memory cells MC in the first memory area A1 and adjusts the reading voltage VR until the number of "0"s read is equal to the first number of "0"s output by the memory controller CN. When the two numbers are equal, the comparator CM outputs the first signal E1. The reading voltage VR corresponding to this condition is then used by the read voltage generator RG to determine a second initial reading voltage for reading memory cells in the second memory area.

In the second operating mode, memory cells are selected from the second memory area A2 by means of the wordline decoder WL and read by the sense amplifiers SA. A second number of "0" is output by the memory controller CN. The second number of "0"s is equal to the number of "0"s stored in the memory cells MC of the second memory area A2. This number is read out from the memory cells of the first memory area A1. It is calculated and stored there by the memory controller CN before the memory cells in the second memory area A2 are programmed. The number of "0"s read from the memory cells of the second memory area A2 are compared to the number of "0"s output by the memory controller CM in the voltage reading control unit RC. However, in contrast to the memory cells of the first memory area A1, it is not possible to read all of the memory cells in the second memory area A2 simultaneously, as each word in the second memory area A2 has to be selected and read separately. The memory cells in a word can be read in parallel, but the words have to be read sequentially. Similar to the first operating mode, the reading voltage VR output by the reading voltage control unit RC is adjusted until the comparator CM outputs the first signal E1 indicating that the number of "0"s read from memory cells in the second memory area A2 is equal to the number of "0"s output by the memory controller CN.

For the method described below for determining a reading voltage suitable for correctly reading data out of the memory M, an equal number of "0"s and "1"s has to be stored in the first memory area A1. This may be achieved by storing a binary number and its complement in the first memory area A1. If the number of "0"s stored in the second memory area A2 is stored in the first memory area A1, then, if the memory cells in the first memory area A1 are read correctly, the number of "0"s stored in the second memory area A2 is also known correctly. If, for example, the word length is 8 bits, meaning that 8 bits are stored in the first memory area A1 and six "0"s are stored in the second memory area A2, the binary number "0110" representing the number 6 and its complement "1001" are stored in the first memory area A1 as "10010110" giving a total count of four "0"s and four "1"s.

It is important that the memory cells in the first memory area A1 can be read simultaneously. The correct reading voltage VR for the first memory area A1 can thus be determined very quickly and used as a starting value for determining the reading voltage VR of the memory cells of the second memory area A2. This allows a suitable reading voltage VR to be always found in a fast and power saving manner.

Figure 6:
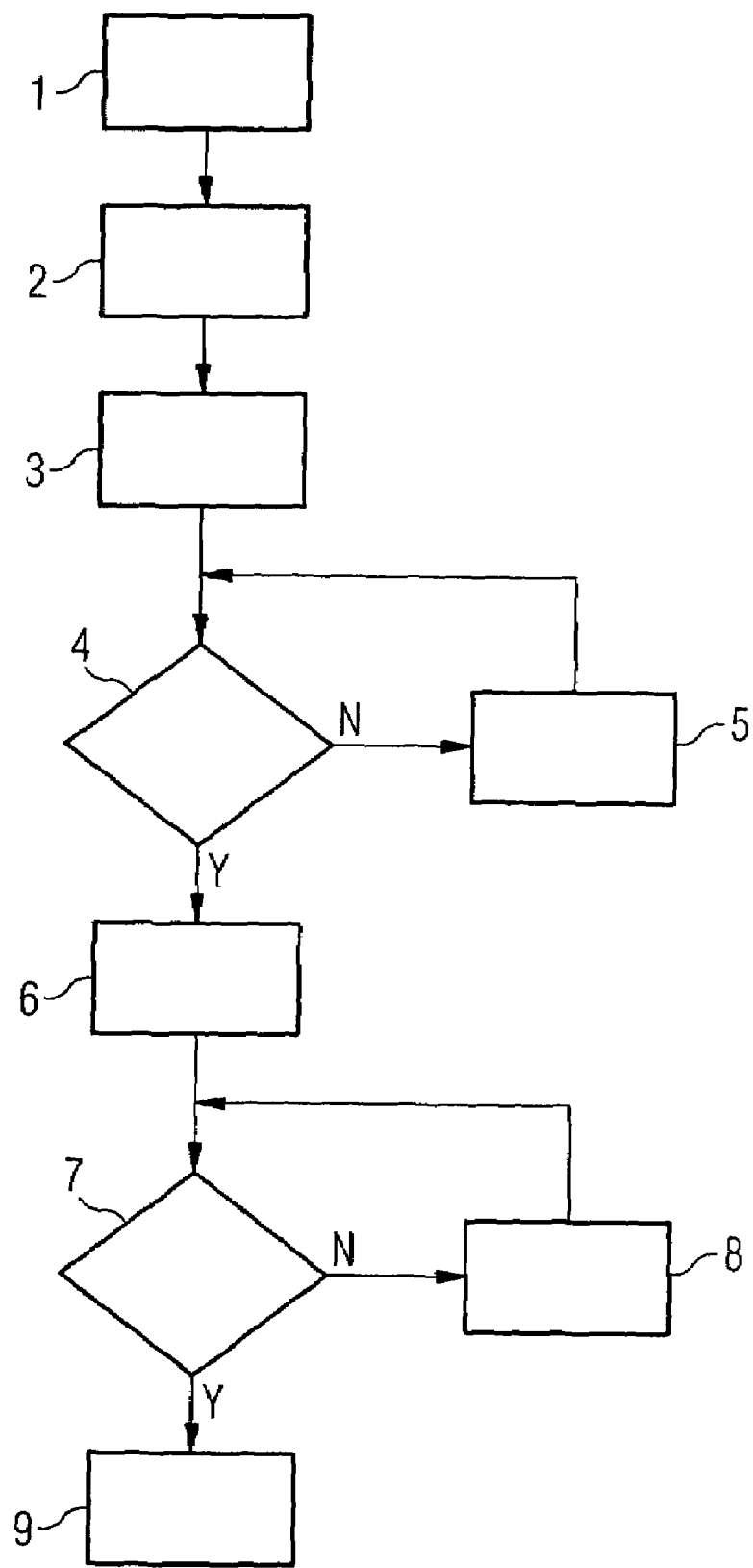
FIG. 6 shows a flow chart according to a method of the invention for determining the reading voltage of the semiconductor memory.

FIG. 6 illustrates a method according to an embodiment of the invention. In a first step 1, the second memory area A2 is programmed with data. In the second step 2, the first memory area A1 is programmed with information representing the number of "0"s programmed in the first step in the second memory area A2. In the third step 3, memory cells of the first memory area A1 are read using an initial first reading voltage Vi1. In the query 4, the reading voltage control unit RC determines if the number of "0"s and "1"s read from memory cells of the first memory area A1 are equal. If this is not the case, the first reading voltage V1 is adjusted in step 5 and the memory cells of the first memory area A1 are re-read until the number of "0"s is equal to the number of "1"s. The voltage for which this is true is called final first reading voltage Vf1 and is then used to determine an initial second reading voltage Vi2 which is used to read the memory cells in the second memory area A2. In query 7, it is determined if the number of "0"s read from the memory cells in the second memory area A2 is equal to the number of "0"s programmed into the second memory area A2. This may be done by using the information stored in the memory cells of the first memory area A1 or by using an external zero counter. If the number of "0"s differ from each other, the second reading voltage V2 is adjusted and the memory cells in the second memory area A2 are re-read until a final second reading voltage Vf2 is determined for which the correct number of "0"s is read from the memory cells of the second memory area A2. In step 9, the final second reading voltage Vf2 is used for reading the memory cells of the semiconductor memory M.

It is obvious that instead of counting "0"s, a person skilled in the art may also count "1"s and use the method and apparatus of the invention.

It will be also apparent to those skilled in the art that various modifications and variations can be made to the structure of the present invention without departing from the scope or the spirit of the invention. In view of the foregoing, it is intended that the present invention covers modifications and variations of this invention provided they fall within the scope of the following claims and their equivalents.

What is claimed is:

1. A method for determining a reading voltage for reading data out of a non-volatile semiconductor memory, wherein the semiconductor memory comprises a plurality of memory cells grouped in a first memory area and a second memory area, the method comprising the steps of:
   storing a given number of "0"s into the second memory area;
   storing an equal number of "0"s and "1"s in the memory cells of the first memory area;
   reading the memory cells of the first memory area using an initial first reading voltage;
   adjusting the first reading voltage and re-reading the memory cells of the first memory area until an equal number of "0"s and "1"s are read out of the memory cells of the first memory area, thus obtaining a final first reading voltage;
   determining an initial second reading voltage on the basis of the final first reading voltage;
   reading the memory cells of the second memory area using the initial second reading voltage;
   adjusting the second reading voltage and re-reading the memory cells of the second memory area until the number of "0"s read is equal to the number of "0"s stored in the second memory area, thus obtaining a final second reading voltage; and
   using the final second reading voltage as a reading voltage for reading the memory cells of the semiconductor memory.

2. The method according to claim 1, wherein the step of storing an equal number of "0"s and "1"s in the memory cells of the first memory area comprises the step of storing a binary number and its complement in the first memory area.

3. The method according to claim 2, wherein the binary number is related to the number of "0"s stored in the second memory area.

4. The method according to claim 2, wherein the binary number is related to the number of read or erase cycles that the semiconductor memory has been subjected to.

5. The method according to claim 2, wherein the binary number is related to the age of the semiconductor memory.

6. The method according to claim 1, wherein the step of reading the memory cells of the first memory area comprises the step of reading the memory cells of the first memory area simultaneously.

7. The method according to claim 2, wherein the initial first reading voltage corresponds to an upper permissible reading voltage of the memory cells.

8. The method according to claim 1, wherein the step of adjusting the first reading voltage comprises the step of decreasing the first reading voltage by first voltage steps.

9. The method according to claim 1, wherein the step of determining an initial second reading voltage comprises the step of decreasing the final first reading voltage by a second voltage step.

10. The method according to claim 8, wherein the step of adjusting the second reading voltage comprises the step of decreasing the second reading voltage by third voltage steps.

11. A method for determining a reading voltage for reading data out of a non-volatile semiconductor memory, wherein the semiconductor memory comprises a plurality of memory cells grouped in a first memory area and a second memory area, the method comprising the steps of:

storing a given number of "0"s into the second memory area;

storing an equal number of "0"s and "1"s in the memory cells of the first memory area;

determining a first reading voltage at which an equal number of "0"s and "1"s are read out of the memory cells of the first memory area;

determining, based on the first reading voltage, a second reading voltage at which an equal number of "0"s read is equal to the number of "0"s stored in the second memory area; and using the second reading voltage as a reading voltage for reading the memory cells of the semiconductor memory.

12. The method according to claim 11, wherein the step of storing an equal number of "0"s and "1"s in the memory cells of the first memory area comprises the step of storing a binary number and its complement in the first memory area.

13. The method according to claim 12, wherein the binary number is related to the number of "0"s stored in the second memory area.

14. The method according to claim 12, wherein the binary number is related to the number of read or erase cycles that the semiconductor memory has been subjected to.

15. The method according to claim 12, wherein the binary number is related to the age of the semiconductor memory.

* * * * *